United States Statutory Invention Registration [19]

[11] Reg. Number: H557

Morris et al.

[43] Published: Dec. 6, 1988

[54] EPITAXIAL STRENGTHENING OF CRYSTALS

[75] Inventors: Robert C. Morris, Ledgewood, N.J.; John E. Marion, II, Livermore, Calif.; Devlin M. Gaultieri, Ledgewood, N.J.

[73] Assignee: The United States of America as represented by the Department of Energy, Washington, D.C.

[21] Appl. No.: 927,993

[22] Filed: Nov. 7, 1986

[51] Int. Cl.[4] ..... C04B 35/40

[52] U.S. Cl. ..... 252/62.57; 156/600; 148/DIG. 12; 148/DIG. 95

[58] Field of Search ..... 156/616, 624; 148/DIG. 95, DIG. 12; 252/62.57

[56] References Cited

U.S. PATENT DOCUMENTS

| | | | |
|---|---|---|---|
| 3,964,035 | 6/1976 | Blank et al. | 252/62.57 |
| 4,263,374 | 4/1981 | Glass et al. | 252/62.57 |
| 4,354,254 | 10/1982 | Blank et al. | 252/62.57 |
| 4,434,212 | 2/1984 | Robertson et al. | 252/62.57 |
| 4,544,239 | 10/1985 | Shone et al. | 252/62.57 |
| 4,544,438 | 10/1985 | Luther et al. | 252/62.57 |
| 4,625,390 | 12/1986 | Shone et al. | 252/62.57 |

*Primary Examiner*—Herbert B. Guynn
*Assistant Examiner*—Eric Jorgensen
*Attorney, Agent, or Firm*—Clifton E. Clouse, Jr.; Roger S. Gaither; Judson R. Hightower

[57] ABSTRACT

An epitaxial layer is used to place the surface of a crystal in compression so as to greatly increase the durability of the crystal such as a laser medium crystal.

7 Claims, 1 Drawing Sheet

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

EPITAXIAL STRENGTHENING OF CRYSTALS

This invention was made jointly in the course of or under Contract No. W-7405-ENG-48 with the U.S. Department of Energy for the operation of Lawrence Livermore National Laboratory and Lawrence Livermore National Laboratory Purchase Order No. 9140605 with Allied Signal Corporation.

BACKGROUND OF THE INVENTION

The invention relates to the properties of crystals, more particularly to the strengthening of crystals, especially for use in lasers.

Single crystals are used in a variety of applications such as in the electronics industry and in the optics industry. In the optical arts, single crystals are grown for laser media, laser amplifiers, harmonic conversion and other uses. Well known examples of laser media single crystals are yttrium aluminum garnet (YAG), gadolinium gallium garnet (GGG), and gadolinium scandium gallium garnet (GSGG).

Much of the work in lasers today is in further development of high average power lasers. Such lasers must not only have high energy in a given laser pulse, but must also have a high repetition rate of those pulses. In the past, laser media were predominately in two geometries: the rod for smaller sizes and the disk for larger sizes. Rods could be crystalline or glass, and larger sizes were made of glass. Due to its low thermal conductivity, glass cannot rapidly remove the heat generated during laser operation. Also, most crystals are inherently stronger than glass and have other desirable spectroscopic properties. Thus, crystals are the favored material for the new laser media.

To minimize adverse optical distortions and maximize surface area available for cooling, slab type geometries are superior to the older rod geometries for high average power solid state layers. The slab has large surface area to take off heat from the sides of the amplifier medium not in the laser beam, and at the same time can be formed from crystalline materials. Current designs for high average power slab lasers have rectangular slab geometries with dimensions on the order of 1 by 10 by 20 centimeters in a single crystal garnet as shown in FIG. 1.

The use of single crystal laser media in high average power laser applications permit superior beam quality and high power output. A fundamental limitation on power output is the component strength as well as thermal conductivity. High power elements require high tensile strength and good component durability. Most larger size prior art solid-state laser media were made typically of glass, and smaller size components were made in a rod geometry of YAG or glass. When the strength problem was encountered in glass laser media one method of increasing strength and resistance to abrasion was found to be placing a compressive, ion-beam sputtered film on the glass substrate as reported in J. E. Marion, "Development of High Strength Solid State Laser Materials", UCRL-93160 Abst. Summary, to be published in *Advances in Laser Science,* 1, Editors W. C. Stwalley and M. Lapp , Amer. Inst. of Phys. Proceedings, 146, pp 234–237 (1986). Attempts to extend compressive layer technology to single crystals have used ion bombardment as reported in T. Hioki et al, "Strengthening of $Al_2O_3$ by Ion Implantation", Journal of Materials Science Letters, 3, pp. 1099–1101 (1984).

Because of the higher average powers at which the new crystalline laser media are expected to operate the laser media are placed under greater operating stress than ever before. These stresses arise from the temperature gradient in the slab. Absorption of flashlamp or other pumping energy leads to heating of the slab bulk. The active cooling of slab surfaces by high velocity fluids leads to a steady state thermal gradient within the slab. The thermal gradient gives rise to biaxial tensile stresses at the slab surfaces whose magnitude can approach or exceed the component strength.

Thus, strengthening a single crystal laser medium permits higher average power output. One approach to strengthening has been to remove or minimize subsurface damage. Subsurface damage has been shown to be removed by the methods of acid etching and by large amounts of material removal in the grinding and polishing fabrication steps. This method is reported in J. E. Marion, "Strengthening of Solid State Laser Materials", Appl. Phys. Lett., 47, pp 694–696 (1985) and is responsible for up to 15 times increase in crystal strength. However, it has been difficult to fully implement this method because it has not been possible to preserve the pristine surfaces throughout the entire process of handling, mounting and use in the laser.

Thus, there is a long standing, unfulfilled need for the strengthening of single crystal laser media. If this need is met, then lasers of significantly higher average power are possible.

SUMMARY OF THE INVENTION

According, it is an object of the invention to strengthen crystals.

It is a further object of the invention to strengthen crystals in a way that is useful in laser media.

It is a further object to increase the durability of strengthened laser media so that the media remains strengthened during use.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

The above objects have been accomplished in the present invention by the method of applying a single crystal epitaxial layer to the surface of a single crystal to be strengthened, with the epitaxial layer material being chosen to place the surfaces under a compressive force.

Epitaxial layers are presently applied to crystals for bubble memory and cathode ray tube applications. Unstrained layers are preferred for these applications. The present invention utilizes epitaxial layers with intentionally high amounts of strain specifically to induce a compressive force and thus strengthen the crystal.

DESCRIPTION OF THE PREFERRED EMBODIMENTS

Figure 1:
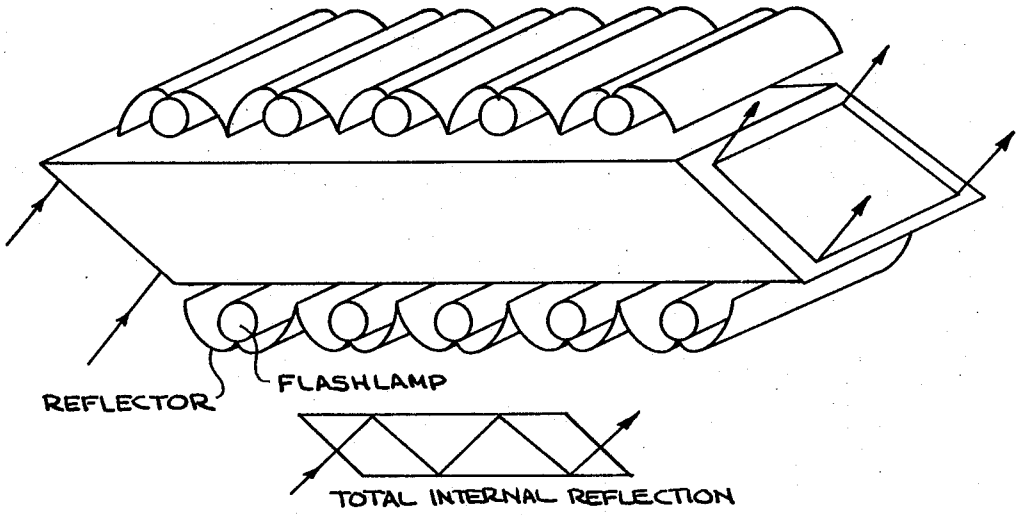
FIG. 1 is a "zig-zag" slab amplifier geometry in which the slab is pumped through the large faces and the extraction beam zig-zag through the slab by total internal reflection.
Figure 2:
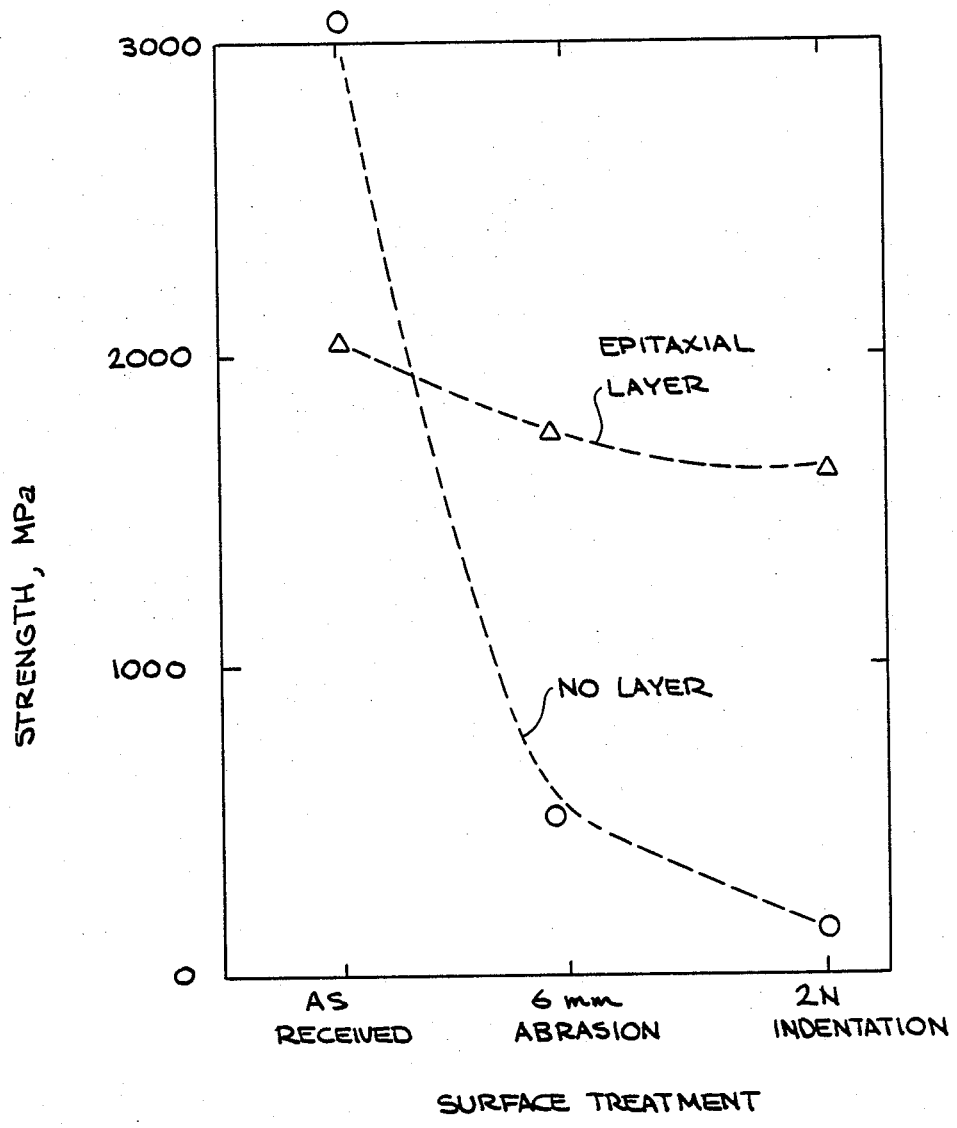
FIG. 2 is a graph strength of GGG substrates with, and without, repressive epitaxial layers as a function of surface abrasion treatment.

In choosing a crystalline material to be grown on the surface of another crystal in order to place that crystal in compression according to the present invention, a mismatch in the relative size of the lattice spacings of the crystals are used. The basic requirement is that the lattice spacing of the epitaxial crystal material be slightly larger than the lattice spacing of the substrate crystal to be strengthened. A preferred method for achieving this is to dope the epitaxial material with a dopant having a larger lattice spacing than in the unsubstituted crystal. Otherwise the epitaxial material can be the same or similar material as the substrate. The strain on the substrate surface has been found to be best in the 0.01% to 0.3% range with about 0.1% as the optimum. Strain is defined as substrate characteristic length subtracted from the corresponding epitaxial layer characteristic length divided by the substrate characteristic length. The characteristic length may be an average crystal lattice spacing.

The following is a description of epitaxial layers grown according to the present invention which were used to demonstrate the concept. The substrates were 111|-oriented GGG prepared as one inch diameter, 0.020 inch thickness, wafers with low subsurface damage polish and a final colloidal silica polish on both sides. These were the same type of substrates as are used for the epitaxial growtn of iron garnets for bubble memory devices in the electronics industry. These wafers had small orientation flats in the 112| and 110| directions and were specified to have less than five dislocations over the central 80% of area, less than two defects per square centimeter over the central 80% of area, flatness better than six fringes using green (546 nm) light over the central 80% of area, and a taper of less than 0.0015 inch across the diameter. While the tests have been thus far on these substrates, the application could have been to the slab surfaces of a laser medium as well.

Epitaxial growth was performed in a class 100 clean hood. The substrates were cleaned thoroughly with a mildly caustic cleaning solution and rinsed in deionized water before growth. A supercooled lead oxide flux (see Table 1) was used for the liquid phase epitaxial growth using the isothermal dipping techniques with rotation (200 revolutions/minute) of the horizontally held substrates. For more on this well known technique see H. J. Levinstein, et al., Appl. Phys. Lett. 19, 486 (1971).

To induce the compressive surface stress neodymium substituted GGG was grown on pure GGG substrates. Neodymium has a larger ionic radius than gadolinium, and incorporation of Nd on Gd sites in the garnet gives a larger lattice constant. The melt composition (Table 1) allowed a growth rate of about one micron per minute when supercooled by 15 degrees centigrade to the growth temperature of 895 degrees centigrade. Layers of about the same thickness are grown on each side of the substrate. Epitaxial growth under these conditions resulted in a strain mismatch between epitaxial layers and substrates of about 0.1%, giving the desired high compressive surface a stress of about 200 MPa.

The characterization of thickness and stain is given as follows. Layer thickness was determined by the increase in weight after growth using a density of 7.068 g/cc with the assumption that layers of equal thickness were grown on each side of the substrate. Experience with bubble memory layers has shown the side to side thickness variation to be minimal (approximately 5%). Lattice constant measurements of the substrate and layers were done with a Bond diffractometer (W. L. Bond, Acta Cryst. 13, 814 (1960); A31, 698 (1975). Using CuK sub alpha radiation, the (888) reflection was excited and the substrate diffraction pattern was superimposed on the epitaxial layer pattern. Since the diffraction measurements are influenced by the strain induced during growth, these measured lattice constants were corrected for strain using the expression:

$$(da/a)=((1-v)/(1+v))(ds/s)$$

where (da/a) is the unstrained misfit, (ds/s) is the measured misfit, and v, Poisson's ratio, is taken to be 0.30, a typical value for gallium garnets.

The substrates were fractured in a ball-on disk-on 3-ball jig which gives equ-biaxial tension along the bottom surface. As control samples, untreated specimens from the same polishing lot were also broken. For this fracture jig, the stress is related to the load by a relation given by J. B. Wachtman, Jr. et al, "Biaxial Flexure Tests of Ceramic Substrates", J. of Materials, 7, pp 188–194 (1972). All samples were fractured at a loading rate of 0.1 mm per minute.

To assess the epitaxial layer resistance to abrasion and in-service flaw generation, two techniques were used. Careless cleaning and handling damage were modeled by abrasion of the substrate using 6 micron diamond paste on a cloth pad with ethylene glycol. Each sample for this treatment was set on the pad, weighted with a one Kg. mass, and then dragged around the pad along a annulus (6 cm radius) for ten revolutions. The samples were then washed off with ethyl alcohol. This treatment models damage created by a particularly careless cleaning of the laser component, or by abrasion from particles in the coolant.

Another area of concern for which a second model abrasion technique was developed is the simulation of damage typical from laser operation. Contaminants on the slab surface are occasionally found to absorb sufficient light that they vaporize explosively, creating small surface pits. To model this type of damage we use a Vickers micro-hardness indentation at a 2N load which is above that required to nucleate radial cracks from the corners of the indentation, causing surface flaws in the sample similar to the damage pits. For testing, substrates were indented at their center with a single indentation at 2N load and fractured with the indented side under tension.

The results of the above tests are given in Tables 2 and 3. The thickness of the epitaxial films and their compressive stress measurements results are given in Table 2. The result of the fracture tests are shown in Table 3 and are graphically illustrated in FIG. 1. The highly polished bare substrates were found to be extremely strong (mean strength=3010 MPa); this presumably reflects the advanced nature of the polishing process required to give adequately low subsurface damage for growth of dislocation-free, epitaxial layers of good quality bubble memory substrate. Growth of the highly strained epitaxial layers reduced the strength of the substrate to 2040 MPa. The enhanced tension just below the epitaxial-layer/substrate interface induced by the compressive stress in the layer is responsible for this decrease in strength. However, it is noted that this value of strength (2040 MPa) is about a factor of five higher than that required for laser media in current designs.

The Table 3 results for abrasion show the clear advantage of the present invention. Abrasion with 6 micron diamond and indentation with a Vickers micro-hardness diamond indenter at 2N load did not substantially degrade the strength of the epitaxial layer substrates. The bare substrates were decreased in strength by the abrasion treatment to a level that would be unusable in current laser designs.

The following are the results of epitaxial layer depositions for strengthening GGG in Table 1:

TABLE 1

| Composition of $(Nd,Gd)_3Ga_5O_{12}$ Melt | | | |
|---|---|---|---|
| Oxide | Weight (grams) | Moles | Mole Fraction |
| PbO | 466.200 | 2.0888 | 0.8983 |
| $B_2O_3$ | 9.322 | 0.1339 | 0.0576 |
| $Ga_2O_3$ | 13.296 | 0.0709 | 0.0305 |
| $Gd_2O_3$ | 8.000 | 0.221 | 0.0095 |
| $Nd_3O_3$ | 3.182 | 0.0095 | 0.0041 |
| Totals | 500.000 | 2.3252 | 1.0000 |

(The growth temperature was 895 degrees centigrade; however, growth of these particular films can take place over a range of 875 to 915 degrees centrigrade).

TABLE 2

| Properties of Compressive Layers of $(Nd,Gd)_3Ga_5O_{12}$ on $Gd_3Ga_5O_{12}$ | | | | | |
|---|---|---|---|---|---|
| Layer Number | Lattice Constant measured Measured (888) nm | Lattice Constant Strain Corrected nm | Weight Layer $5 \times 10^{-3}$ | Calculated Thickness Microns | Calculated Strain Percent |
| 1 | 1.24099 | 1.23979 | 39.7 | 5.3 | 0.113 |
| 2 | 1.24099 | 1.23979 | 33.9 | 4.5 | 0.113 |
| 3 | 1.24099 | 1.23979 | 31.7 | 4.2 | 0.113 |
| 4 | 1.24099 | 1.23979 | 43.7 | 5.8 | 0.113 |
| 5 | 1.24109 | 1.23985 | 42.6 | 5.7 | 0.117 |
| 6 | 1.24109 | 1.23985 | 37.6 | 5.0 | 0.117 |
| 7 | 1.24109 | 1.23985 | 33.2 | 4.4 | 0.117 |
| 8 | 1.24120 | 1.23991 | 49.3 | 6.6 | 0.122 |
| 9 | 1.24120 | 1.23991 | 43.4 | 5.8 | 0.122 |
| 10 | 1.24131 | 1.23997 | 35.9 | 4.4 | 0.127 |
| 11 | 1.24077 | 1.23968 | 463 | 39.6 | 0.103 |
| 12 | 1.24067 | 1.23962 | 334 | 28.5 | 0.099 |
| 13 | 1.24045 | 1.23950 | 23.0 | 3.1 | 0.089 |
| 14 | 1.24099 | 1.23980 | 42.8 | 5.7 | 0.113 |
| 15 | 1.24024 | 1.23939 | 28.9 | 3.9 | 0.080 |
| 16 | 1.24067 | 1.23962 | 32.5 | 4.3 | 0.099 |
| 17 | 1.23971 | 1.23911 | 37.1 | 4.9 | 0.061 |

a. Layer thickness calculated from a density of 7.068 g/cm$^3$; strain correction to lattice constant based on a Poisson ratio of 0.30
b. Layer has approximately $10^2$ triangular defects cm$^{-2}$
c. Layer shows no defects
d. These layers were grown on substrates that were abraded with 6 micron diamond. All diffraction peaks, except for #14, were very broad and indicative of "faceted" growth. The layers also had the frosty appearance of faceted layers. This must be a consequence of the 6 micron abrasion of the substrates, since the strain grown into these layers is too low for spontaneous faceting, and a test layer on a standard highly polished substrate did not show faceting.

TABLE 3

| STRENGTH OF SUBSTRATES | | | | | |
|---|---|---|---|---|---|
| Substrate Surface | Layer Thickness Microns | Strain Percent | Abrasion Treatment | No. of Samples | Mean Strength MPa |
| polished | none | none | none | 6 | 3010 |
| polished | 5 | 0.1 | none | 6 | 2040 |
| polished | none | none | 6 micron abrasion | 2 | 560 |
| polished | 5 | 0.1 | 6 micron abrasion | 2 | 1745 |
| polished | none | none | 2N indentation | 2 | 157 |
| polished | 5 | 0.1 | 2N indentation | 2 | 1610 |

TABLE 3-continued

| STRENGTH OF SUBSTRATES | | | | | |
|---|---|---|---|---|---|
| Substrate Surface | Layer Thickness Microns | Strain Percent | Abrasion Treatment | No. of Samples | Mean Strength MPa |
| 6 micron abrasion | none | none | none | 4 | 310 |
| 6 micron abrasion | 5 | 0.1 | none | 4 | 390 |
| 6 micron abrasion | none | none | 2N indentation | 1 | 102 |
| 6 micron abrasion | 5 | 0.1 | 2N indentation | 1 | 171 |

TABLE 4

| Composition of $(Ca,Sn,Y)_3Ga_5)_{12}$ | | | |
|---|---|---|---|
| Oxide | Mole Fraction | Mole | Grams |
| PbO | 0.80782 | 2.58847 | 577.71811 |
| $Ga_2O_3$ | 0.04285 | 0.13732 | 25.73885 |
| $SnO_2$ | 0.00429 | 0.01373 | 2.06926 |
| CaO | 0.00429 | 0.01373 | 0.77009 |
| $Bi_2O_3$ | 0.13464 | 0.43141 | 201.01947 |
| $Y_2O_3$ | 0.00612 | 0.01962 | 4.42972 |
| Totals | | 3.20427668 | 811.74551013 |

(Projected that at 925 degrees centigrade the growth rate would be about 1 mm per minute to yield a 0.1% strain layer on GGG; growth can take place in the range 905 to 945 degrees centigrade)

TABLE 5

| Composition of $Y_3(Sc,Al)_5O_{12}$ | | | |
|---|---|---|---|
| Oxide | Mole Fraction | Mole | Grams |
| PbO | 0.90282 | 2.15423 | 480.80200 |
| $Al_2O_3$ | 0.01703 | 0.04065 | 4.14437 |
| $Sc_2O_3$ | 0.00043 | 0.00102 | 0.14014 |
| $B_2O_3$ | 0.07524 | 0.17952 | 12.49820 |
| $Y_2O_3$ | 0.00448 | 0.01070 | 2.41540 |
| Totals | | 2.38611000 | 500.00000000 |

(Projected that at 1070 degrees centigrade the growth rate would be about 1.5 microns per minute to yield a 0.1% strain layer on YAG; growth can take place in the range of 1050 to 1090 degrees centrigrade)

The foregoing description of a preferred embodiment of the invention has been presented for purposes of illustration and description. It is not intended to be exhaustive or to limit the invention to the precise form disclosed, and obviously many modifications and variations are possible in light of the above teaching. The embodiment was chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A method for strengthening single crystal laser media, the method comprising:

providing a single crystal laser media to be strengthened;

choosing an epitaxial layer material which will produce a strain of 0.01 to 0.3% when applied to the crystal; and applying the epitaxial layer to the crystal.

2. The method of claim 1 wherein the strain produced is substantially 0.1%.

3. The method of claim 1 wherein the crystal is yttrium aluminum garnet.

4. The method of claim 1 wherein the crystal is gadolinium gallium garnet.

5. The method of claim 1 wherein the crystal is gadolinium scandium gallium garnet.

6. The method of claim 1 wherein the epitaxial layer is applied in a lead oxide flux.

7. The method of claim 1 wherein the epitaxial layer is applied by a molecular beam.

* * * * *